US012690323B2

(12) United States Patent
Ahn et al.

(10) Patent No.: US 12,690,323 B2
(45) Date of Patent: Jul. 21, 2026

(54) ORGANIC LIGHT EMITTING DIODE AND ORGANIC LIGHT EMITTING DEVICE

(71) Applicant: LG Display Co., Ltd., Seoul (KR)

(72) Inventors: Byung-Gun Ahn, Paju-si (KR); Sung-Min Jo, Paju-si (KR); Myeong-Seon Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 400 days.

(21) Appl. No.: 18/236,039

(22) Filed: Aug. 21, 2023

(65) Prior Publication Data

US 2024/0206214 A1 Jun. 20, 2024

(30) Foreign Application Priority Data

Dec. 15, 2022 (KR) ........................ 10-2022-0175839

(51) Int. Cl.

| | |
|---|---|
| ***H10K 50/13*** | (2023.01) |
| ***H10K 50/15*** | (2023.01) |
| ***H10K 50/16*** | (2023.01) |
| ***H10K 50/858*** | (2023.01) |

(52) U.S. Cl.

CPC ............. *H10K 50/13* (2023.02); *H10K 50/15* (2023.02); *H10K 50/16* (2023.02); *H10K 50/858* (2023.02)

(58) Field of Classification Search

CPC ........ H10K 50/13; H10K 50/15; H10K 50/16; H10K 50/858

See application file for complete search history.

(56) References Cited

U.S. PATENT DOCUMENTS

| | | | | |
|---|---|---|---|---|
| 11,031,577 | B1 | 6/2021 | Hamer et al. | |
| 2016/0181560 | A1* | 6/2016 | Yamamoto | H10K 50/13 257/40 |
| 2019/0319209 | A1* | 10/2019 | Tanaka | H10K 50/13 |
| 2020/0006443 | A1* | 1/2020 | Park | H10K 59/80518 |
| 2020/0328256 | A1* | 10/2020 | Lee | H10K 59/38 |
| 2021/0202607 | A1* | 7/2021 | Lee | H10K 50/15 |
| 2022/0077426 | A1* | 3/2022 | Chen | H10K 50/16 |
| 2022/0199929 | A1* | 6/2022 | Park | H10K 50/11 |
| 2023/0157157 | A1* | 5/2023 | Jeong | H10K 85/633 257/40 |

(Continued)

FOREIGN PATENT DOCUMENTS

| | | |
|---|---|---|
| KR | 10-2100581 B1 | 4/2020 |
| KR | 10-2021-0082585 | 7/2021 |

(Continued)

OTHER PUBLICATIONS

Office Action dated Feb. 2, 2026, issued in Korean Patent Application No. 10-2022-0175839.

*Primary Examiner* — Tracie Y Green

(74) *Attorney, Agent, or Firm* — PnK IP LLC

(57) ABSTRACT

An OLED includes a plurality of emitting parts among which a first emitting part includes an electron transport layer and a second emitting part includes a hole transport layer spaced apart from a second emitting material layer. At least one of the hole transport layer and the electron transport layer may include a high refractive material, so that, an optical location of the OLED may be controlled. The OLED with driving at low power consumption, improved blue light luminous efficiency and white light luminance and a stable viewing angle may be implemented.

21 Claims, 5 Drawing Sheets

(56) References Cited

U.S. PATENT DOCUMENTS

2025/0089442 A1* 3/2025 Wang .................. H10K 59/876
2025/0120251 A1* 4/2025 Wu ....................... H10K 50/13

FOREIGN PATENT DOCUMENTS

KR 10-2021-0135971 11/2021
KR 10-2022-0091166 6/2022
KR 20220094623 A 7/2022

* cited by examiner

ORGANIC LIGHT EMITTING DIODE AND ORGANIC LIGHT EMITTING DEVICE

CROSS-REFERENCE TO RELATED APPLICATION

This application claims the priority of Korean Patent Application No. 10-2022-0175839, filed on Dec. 15, 2022, which is hereby incorporated by reference in its entirety.

BACKGROUND

Field of the Disclosure

The present disclosure relates to an organic light emitting diode, and more particularly to, an organic light emitting diode (OLED) that may be driven at low power consumption, may have improved luminous efficiency and/or luminous luminance, as well as to an organic light emitting device including the OLED (e. g., a display device or a lighting device).

Description of the Background

Flat panel display devices including an organic light emitting diode (OLED), have been investigated as display devices that may replace a liquid crystal display device (LCD). The OLED may be formed as a thin organic film and the electrode configurations may implement unidirectional or bidirectional images. Also, the OLED may be formed even on a flexible transparent substrate such as a plastic substrate so that a flexible or a foldable display device may be realized with ease using the OLED. In addition, the OLED may be driven at a lower voltage and the OLED has advantageous high color purity compared to the LCD.

However, there remains a need to develop OLEDs and devices comprising thereof that have improved luminous efficiency and luminous lifespan. Since fluorescent materials use only singlet excitons in the luminous process, the related art fluorescent material shows low luminous efficiency.

Meanwhile, phosphorescent materials may show high luminous efficiency since they use triplet exciton as well as singlet excitons in the luminous process. But, examples of such phosphorescent material include metal complexes, which may have a short luminous lifespan for commercial use. As such, there remains a need to develop an OLED with sufficient luminous efficiency and luminous lifespan.

SUMMARY

Accordingly, the present disclosure is directed to an organic light emitting diode and an organic light emitting device that substantially obviate one or more of problems due to limitations and disadvantages described above.

More specifically, the present disclosure is to provide an organic light emitting diode that may be driven at low power consumption and may have beneficial luminous efficiency and luminous luminance, as well as an organic light emitting device including the organic light emitting diode.

Additional features and aspects will be set forth in the description that follows, and in part will be apparent from the description, or may be learned by practice of the disclosed concepts provided herein. Other features and aspects of the disclosed concept may be realized and attained by the structure particularly pointed out in the written description, or derivable therefrom, and the claims hereof as well as the appended drawings.

To achieve these and other advantages and in accordance with the present disclosure, as embodied and broadly described, an organic light emitting diode that includes a first electrode; a second electrode facing the first electrode; and an emissive layer disposed between the first electrode and the second electrode, wherein the emissive layer comprises a first emitting part disposed between the first electrode and the second electrode; a second emitting part disposed between the first emitting part and the second electrode; a third emitting part disposed between the second emitting part and the second electrode; a fourth emitting part disposed between the third emitting part and the second electrode; a first charge generation layer disposed between the first emitting part and the second emitting part; a second charge generation layer disposed between the second emitting part and the third emitting part; and a third charge generation layer disposed between the third emitting part and the fourth emitting part, wherein the first emitting part comprises a first emitting material layer; and an electron transport layer disposed between the first emitting material layer and the first charge generation layer, wherein the second emitting part comprises a second emitting material layer; and a hole transport layer disposed between the second emitting material layer and the first charge generation layer and spaced apart from the second emitting material layer, and wherein at least one of the electron transport layer and the hole transport layer has a refractive index in a range between about 1.9 and about 2.1.

The hole transport layer may have a refractive index in a range between about 1.9 and about 2.0.

The hole transport layer may have a thickness in a range between about 400 Å and about 470 Å, for example, between about 420 Å and about 450 Å.

The electron transport layer may have a refractive index in a range between about 1.9 and about 1.95

The electron transport layer may have a thickness in a range between about 650 Å and about 800 Å, for example, between about 700 Å and about 750 Å.

The hole transport layer and the electron transport layer may have a refractive index in a range between about 1.9 and about 2.0.

The hole transport layer may have a thickness in a range between about 370 Å and about 570 Å and/or the electron transport layer may have a thickness in a range between about 100 Å and about 300 Å.

The first emitting part may comprise a red emitting material layer, each of the second emitting part and the fourth emitting part may comprise a blue emitting material layer, and the third emitting part may comprise a green emitting material layer.

In another aspect of the present disclosure, an organic light emitting diode includes a first electrode; a second electrode facing the first electrode; and an emissive layer disposed between the first electrode and the second electrode, wherein the emissive layer comprises a first emitting part disposed between the first electrode and the second electrode; a second emitting part disposed between the first emitting part and the second electrode; a third emitting part disposed between the second emitting part and the second electrode; a fourth emitting part disposed between the third emitting part and the second electrode; a first charge generation layer disposed between the first emitting part and the second emitting part; a second charge generation layer disposed between the second emitting part and the third emitting part; and a third charge generation layer disposed between the third emitting part and the fourth emitting part, wherein the first emitting part comprises a hole injection layer disposed between the first electrode and the first charge generation layer; a first hole transport layer disposed between the hole injection layer and the first charge generation layer; a red emitting material layer disposed between the first hole transport layer and the first charge generation layer; and a first electron transport layer disposed between the red emitting material layer and the first charge generation layer, wherein the second emitting part comprises a second hole transport layer disposed between the first charge generation layer and the second charge generation layer; a third hole transport layer disposed between the second hole transport layer and the second charge generation layer; a first blue emitting material layer disposed between the third hole transport layer and the second charge generation layer; and a second electron transport layer disposed between the first blue emitting material layer and the second charge generation layer, wherein the third emitting part comprises a fourth hole transport layer disposed between the second charge generation layer and the third charge generation layer; a green emitting material layer disposed between the fourth hole transport layer and the third charge generation layer; and a third electron transport layer disposed between the green emitting material layer and the third charge generation layer, wherein the fourth emitting part comprises a fifth hole transport layer disposed between the third charge generation layer and the second electrode; a sixth hole transport layer disposed between the fifth hole transport layer and the second electrode; a second blue emitting material layer disposed between the sixth hole transport layer and the second electrode; a fourth electron transport layer disposed between the second blue emitting material layer and the second electrode; and an electron injection layer disposed between the fourth electron transport layer and the second electrode, and wherein at least one of the first electron transport layer and the second hole transport layer has a refractive index in a range between about 1.9 and about 2.1.

In yet another aspect, the present disclosure provides an organic light emitting device, for example, an organic light emitting display device or an organic light emitting illumination device that includes a substrate and the organic light emitting diode over the substrate.

In one or more aspects, the OLED includes a plurality of emitting parts, and at least one of the electron transport layer in the first emitting part disposed adjacently to the first electrode and the hole transport layer spaced apart from an emitting material layer in the second emitting part disposed adjacently to the first emitting part includes the high refractive material.

As the common layer in the first emitting part and/or the second emitting part includes the high refractive material, the blue light luminous efficiency may be improved. The OLED and the organic light emitting device that may be driven at low power consumption with improving its white light luminous luminance and maintaining color viewing angles may be implemented.

It is to be understood that both the foregoing general description and the following detailed description are merely by way of example and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate aspects of the disclosure and together with the description serve to explain principles of the disclosure.

In the drawings.

DETAILED DESCRIPTION

Reference will now be made in detail to aspects of the disclosure, examples of which are illustrated in the accompanying drawings. Wherever possible, the same reference numbers will be used throughout the drawings to refer to the same or like parts. In the following description, when a detailed description of well-known functions or configurations related to this document is determined to unnecessarily cloud a gist of the inventive concept, the detailed description thereof will be or may be omitted. The progression of processing steps and/or operations described is an example; however, the sequence of steps and/or operations is not limited to that set forth herein and may be changed as is known in the art, with the exception of steps and/or operations necessarily occurring in a particular order. Names of the respective elements used in the following explanations are selected only for convenience of writing the specification and may be thus different from those used in actual products. Further, all the components of each organic light emitting diode (OLED) and each organic light emitting device (e. g., display device, illumination device, etc.) using the OLED according to all aspects of the present disclosure are operatively coupled and configured.

The present disclosure relates to an organic light emitting diode and/or an organic light emitting device that may improve blue light luminous efficiency and white light luminous luminance with maintaining its color viewing angles by applying high refractive material in a common layer. The organic light emitting diode may be applied to an organic light emitting device such as an organic light emitting display device or an organic light emitting illumination device.

Figure 1:
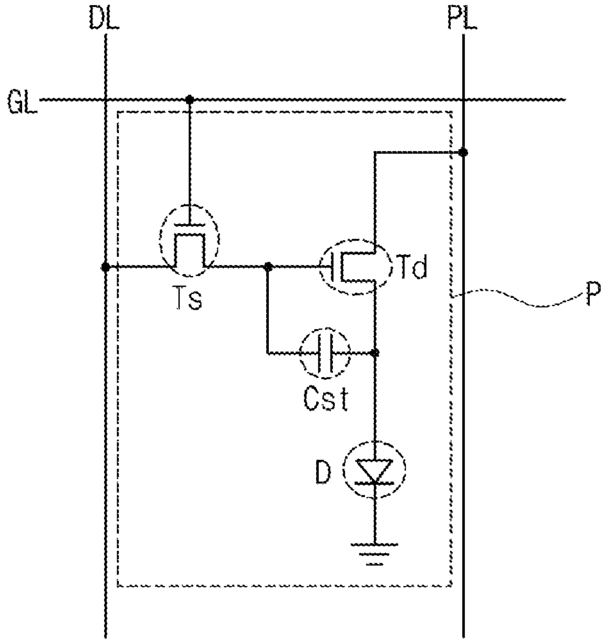
FIG. 1 illustrates a schematic circuit diagram of an organic light emitting display device according to one or more aspects of the present disclosure.

FIG. 1 illustrates a schematic circuit diagram of an organic light emitting display device in accordance with one or more aspects of the present disclosure.

Figure 2:
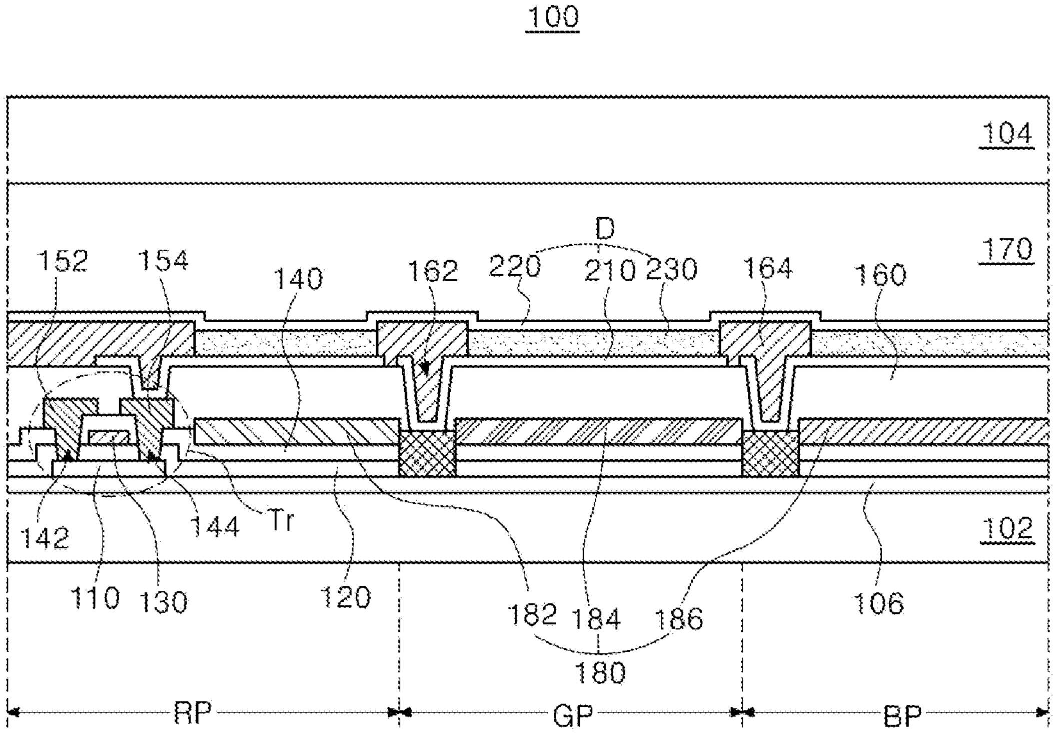
FIG. 2 illustrates a cross-sectional view of an organic light emitting display device as an example of an organic light emitting device in accordance with an example aspect of the present disclosure.

As illustrated in FIG. 1, a gate line GL, a data line DL and a power line PL, each of which crosses each other and defines a pixel region P, are provided in an organic light emitting display device 100 (shown in FIG. 2). A switching thin film transistor Ts, a driving thin film transistor Td, a storage capacitor Cst and an organic light emitting diode D are disposed within the pixel region P. The pixel region P may include a red (R) pixel region, a green (G) pixel region and a blue (B) pixel region. However, aspects of the present disclosure are not limited to such examples. The organic light emitting display device 100 includes a plurality of such pixel regions P which may be arranged in a matrix configuration or other configurations.

The switching thin film transistor Ts is connected to the gate line GL and the data line DL. The driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied to the gate line GL, a data signal applied to the data line DL is applied to a gate electrode of the driving thin film transistor Td and one electrode of the storage capacitor Cst through the switching thin film transistor Ts.

The driving thin film transistor Td is turned on by the data signal applied to a gate electrode 130 (shown in FIG. 2) so that a current proportional to the data signal is supplied from the power line PL to the organic light emitting diode D through the driving thin film transistor Td. And then, the organic light emitting diode D emits light having a luminance proportional to the current flowing through the driving thin film transistor Td. In this case, the storage capacitor Cst is charged with a voltage proportional to the data signal so that the voltage of the gate electrode in the driving thin film transistor Td is kept constant during one frame. Therefore, the organic light emitting display device may display a desired image.

FIG. 2 illustrates a schematic cross-sectional view of an organic light emitting display device in accordance with an aspect of the present disclosure. The pixel circuit configuration of FIG. 1 may be used in the display device of FIG. 2 or other figures of the present application.

As illustrated in FIG. 2, the organic light emitting display device 100 includes a first substrate 102 that defines each of a red pixel region RP, a green pixel region GP and a blue pixel region BP, a second substrate 104 facing the first substrate 102, a thin film transistor Tr on the first substrate 102, an organic light emitting diode (OLED) D disposed between the first and second substrates 102 and 104 and emitting white (W) light and a color filter layer 180 disposed between the OLED D and the first substrate 102. The organic light emitting display device 100 may include a plurality of such pixel regions arranged in a matrix configuration or other suitable configurations.

Each of the first substrate 102 and the second substrate 104 may include, but is not limited to, glass, flexible material and/or polymer plastics. For example, each of the first and second substrates 102 and 104 may be made of, but is not limited to, polyimide (PI), polyethersulfone (PES), polyethylenenaphthalate (PEN), polyethylene terephthalate (PET), polycarbonate (PC) and/or combinations thereof. The first substrate 102, on which a thin film transistor Tr and the OLED D are arranged, forms an array substrate. In certain aspects, the second substrate 104 may be omitted.

A buffer layer 106 may be disposed on the first substrate 102. The thin film transistor Tr may be disposed on the buffer layer 106 correspondingly to each of the red pixel region RP, the green pixel region GP and the blue pixel region BP. In certain aspects, the buffer layer 106 may be omitted.

A semiconductor layer 110 is disposed on the buffer layer 106. In one aspect, the semiconductor layer 110 may include, but is not limited to, oxide semiconductor materials. In this case, a light-shield pattern may be disposed under the semiconductor layer 110, and the light-shield pattern may prevent light from being incident toward the semiconductor layer 110, thereby, preventing or reducing the semiconductor layer 110 from being degraded by the light. Alternatively, the semiconductor layer 110 may include polycrystalline silicon. In this case, opposite edges of the semiconductor layer 110 may be doped with impurities.

A gate insulating layer 120 including an insulating material is disposed on the semiconductor layer 110. The gate insulating layer 120 may include, but is not limited to, an inorganic insulating material such as silicon oxide ($SiO_x$, wherein $0<x\leq 2$) or silicon nitride ($SiN_x$, wherein $0<x\leq 2$).

A gate electrode 130 made of a conductive material such as a metal is disposed on the gate insulating layer 120 to correspond to a center of the semiconductor layer 110. While the gate insulating layer 120 is disposed on the entire area of the substrate 102 as shown in FIG. 2, the gate insulating layer 120 may be patterned identically as the gate electrode 130.

An interlayer insulating layer 140 including an insulating material is disposed on the gate electrode 130 and covers an entire surface of the substrate 102. The interlayer insulating layer 140 may include, but is not limited to, an inorganic insulating material such as silicon oxide ($SiO_x$, wherein $0<x\leq 2$) or silicon nitride ($SiN_x$, wherein $0<x\leq 2$), or an organic insulating material such as benzocyclobutene or photo-acryl.

The interlayer insulating layer 140 has first and second semiconductor layer contact holes 142 and 144 that expose or do not cover a portion of the surface nearer to the opposing ends than to a center of the semiconductor layer 110. The first and second semiconductor layer contact holes 142 and 144 are disposed on opposite sides of the gate electrode 130 and spaced apart from the gate electrode 130. The first and second semiconductor layer contact holes 142 and 144 are formed within the gate insulating layer 120 in FIG. 2. Alternatively, in certain aspects, the first and second semiconductor layer contact holes 142 and 144 may be formed only within the interlayer insulating layer 140 when the gate insulating layer 120 is patterned identically as the gate electrode 130.

A source electrode 152 and a drain electrode 154, which are made of conductive material such as a metal, are disposed on the interlayer insulating layer 140. The source electrode 152 and the drain electrode 154 are spaced apart from each other on opposing sides of the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 2 has a coplanar structure in which the gate electrode 130, the source electrode 152 and the drain electrode 154 are disposed on the semiconductor layer 110. Alternatively, the thin film transistor Tr may have an inverted staggered structure in which a gate electrode is disposed under a semiconductor layer and a source and drain electrodes are disposed on the semiconductor layer. In this case, the semiconductor layer may include amorphous silicon.

The gate line GL and the data line DL, which cross each other to define a pixel region P, and a switching element Ts, which is connected to the gate line GL and the data line DL, may be further formed in the pixel region P. The switching element Ts is connected to the thin film transistor Tr, which is a driving element. In addition, the power line PL is spaced apart in parallel from the gate line GL or the data line DL. The thin film transistor Tr may further include a storage capacitor Cst configured to constantly keep a voltage of the gate electrode 130 for one frame.

A passivation layer 160 is disposed on the source and drain electrodes 152 and 154 and covers the thin film transistor Tr over the whole first substrate 102. The passivation layer 160 has a flat top surface and a drain contact hole (or a contact hole) 162 that exposes or does not cover the drain electrode 154 of the thin film transistor Tr. While the drain contact hole 162 is disposed on the second semiconductor layer contact hole 144, it may be spaced apart from the second semiconductor layer contact hole 144.

The organic light emitting diode (OLED) D includes a first electrode 210 that is disposed on the passivation layer 160 and connected to the drain electrode 154 of the thin film transistor Tr. The OLED D further includes an emissive layer 230 and a second electrode 220 each of which is disposed sequentially on the first electrode 210.

The first electrode 210 which is formed for each of the pixel regions RP, GP and BP may be an anode and include conductive material having relatively high work function value. For example, the first electrode 210 may include a transparent conductive oxide (TCO). In an aspect, the first electrode 210 may include, but is not limited to, indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and/or combinations thereof.

In one aspect, when the organic light emitting display device 100 is a bottom-emission type, the first electrode 210 may have a single-layered structure of the TCO. Alternatively, when the organic light emitting display device 100 is a top-emission type, a reflective electrode or a reflective layer may be disposed under the first electrode 210. For example, the reflective electrode or the reflective layer may include, but is not limited to, silver (Ag) or aluminum-palladium-copper (APC) alloy. For example, in the OLED D of the top-emission type, the first electrode 210 may have a triple-layered structure of ITO/Ag/ITO or ITO/APC/ITO.

In addition, a bank layer 164 is disposed on the passivation layer 160 to cover edges of the first electrode 210. The bank layer 164 exposes or does not cover a center of the first electrode 210 corresponding to each of the red pixel region RP, the green pixel region GP and the blue pixel region BP. In certain aspects, the bank layer 164 may be omitted.

Figure 3:
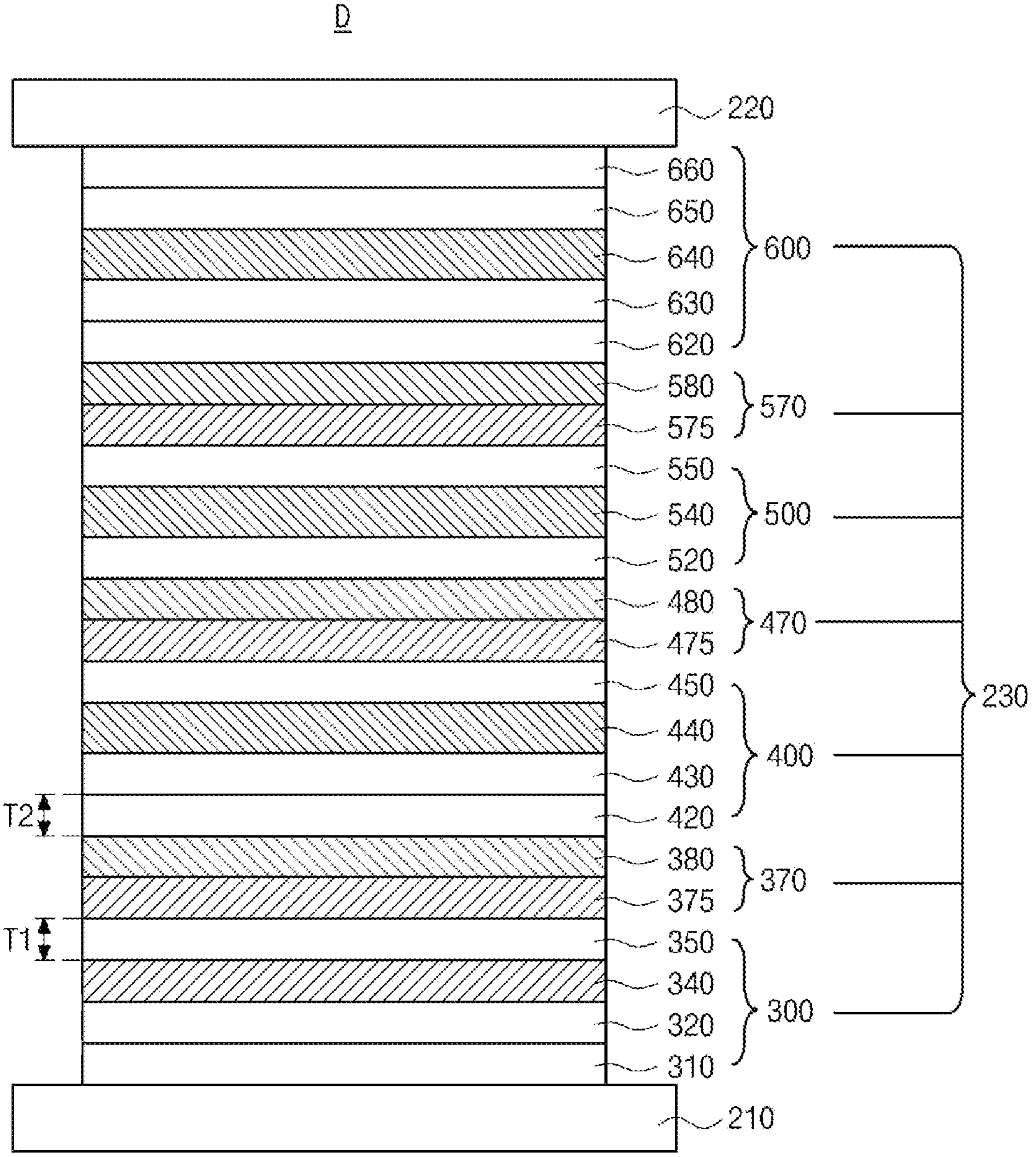
FIG. 3 illustrates a cross-sectional view of an organic light emitting diode having four emitting parts in accordance with an example aspect of the present disclosure.

The emissive layer 230 is disposed on the first electrode 210. The emissive layer 230 may include at least one emitting part. For example, as illustrated in FIG. 3, the emissive layer 230 may include a plurality of emitting parts 300, 400, 500 and 600 and a plurality of charge generation layers 370, 470 and 570. In one aspect, each of the emitting parts 300, 400, 500 and 600 may have a single-layered structure of an emitting material layer (EML).

In another aspect, each of the emitting parts 300, 400, 500 and 600 in the emissive layer 230 may have a multiple-layered structure of a hole injection layer (HIL), a hole transport layer (HTL), an electron blocking layer (EBL), an EML, a hole blocking layer (HBL), an electron transport layer (ETL), an electron injection layer (EIL).

The emissive layer 230 may have multiple emitting parts to form a tandem structure. For example, the emissive layer 230 may be applied to an organic light emitting diode of a tandem structure stacked by multiple emitting parts, located at each of the red pixel region RP, the green pixel region GP and the blue pixel region BP. A portion of the carrier transporting layers in the emissive layer 230 may include high refractive material so that the OLED may have beneficial blue light luminous efficiency and white light luminance as well as may secure excellent color viewing angles.

The second electrode 220 is disposed on the first substrate 102 above which the emissive layer 230 is disposed. The second electrode 220 may be disposed on the entire display area. The second electrode 220 may include a conductive material with a relatively low work function value compared to the first electrode 210. The second electrode 220 may be a cathode providing electrons. For example, the second electrode 220 may include highly reflective material such as aluminum (Al), magnesium (Mg), calcium (Ca), silver (Ag), alloy thereof such as aluminum-magnesium alloy (Al—Mg) and/or combinations thereof.

In addition, an encapsulation film 170 may be disposed on the second electrode 220 to prevent or reduce outer moisture from penetrating into the OLED D. The encapsulation film 170 may have, but is not limited to, a laminated structure of a first inorganic insulating film, an organic insulating film and a second inorganic insulating film. In certain aspects, the encapsulation film 170 may be omitted.

The organic light emitting display device 100 may further include a polarizing plate to reduce reflection of external light. For example, the polarizing plate may be a circular polarizing plate. When the organic light emitting display device 100 is a bottom-emission type, the polarizing plate may be disposed under the first substrate 102. When the organic light emitting display device 100 is a top-emission type, the polarizing plate may be disposed on the encapsulation film 170 or the second electrode 220. In addition, a cover window may be attached to the encapsulation film 170 or the polarizing plate. In this case, the first substrate 102, the second substrate 104 and the cover window may have a flexible property, thus the organic light emitting display device 100 may be a flexible display device.

The color filter layer 180 is disposed between the first substrate 102 and the OLED D, for example, the interlayer insulating layer 140 and the passivation layer 160. The color filter layer 180 may include a red color filter pattern 182, a green color filter pattern 184 and a blue color filter pattern 186 which are disposed correspondingly to the red pixel region RP, the green pixel region GP and the blue pixel region BP, respectively.

In the organic light emitting display device 100, the light emitted from the emissive layer 230 is incident to the color filter layer 180 through the first electrode 210, and the color filter layer 180 is disposed under the OLED D. The organic light emitting display device 100 may be a bottom-emission type. Alternatively, when the organic light emitting display device 100 is a top-emission type, the light emitted from the OLED D is transmitted through the second electrode 220, and the second electrode 220 may be thin to have light-transmissive (semi-transmissive) property and the color filter layer 180 may be disposed on the OLED D. In this case, the color filter layer 180 may be attached to the OLED D by adhesive layer. Alternatively or additionally, the color filter layer 180 may be disposed directly on the OLED D.

In addition, a color conversion layer may be formed or disposed between the OLED D and the color filter layer 180. The color conversion layer may include a red color conversion layer, a green color conversion layer and a blue color conversion layer each of which is disposed correspondingly to each pixel region (RP, GP and BP), respectively, to convert the white (W) color light to each of a red, green and blue color lights, respectively. For example, the color conversion layer may include quantum dots so that the color purity of the organic light emitting display device 100 may be further improved. Alternatively, the organic light emitting display device 100 may comprise the color conversion layer instead of the color filter layer 180.

The OLED D is described in more detail. FIG. 3 illustrates a schematic cross-sectional view of an organic light emitting diode having a plurality of emitting parts in accordance with an aspect of the present disclosure. For instance, FIG. 3 shows an example (OLED D) of the OLED D in FIGS. 1 and 2.

As illustrated in FIG. 3, the organic light emitting diode (OLED) D in accordance with an example of the present disclosure includes a first electrode 210, a second electrode 220 facing the first electrode 210 and an emissive layer 230 disposed between the first electrode 210 and the second electrode 220. The organic light emitting display device 100 includes the red pixel region RP, the green pixel region GP and the blue pixel region BP, and the OLED D1 may be disposed in the red pixel region RP, the green pixel region GP and the blue pixel region BP.

One of the first electrode 210 and the second electrode 220 may be an anode and the other of the first electrode 210 and the second electrode 220 may be a cathode. For example, the first electrode 210 may be the anode and the second electrode 220 may be the cathode. For example, each of the first electrode 210 and the second electrode 220 may have a thickness, but is not limited to, between about 100 Å and about 2000 Å.

The emissive layer 230 may include a first emitting part 300 disposed between the first electrode 210 and the second electrode 220, a second emitting part 400 disposed between the first emitting part 300 and the second electrode 220, a third emitting part 500 disposed between the second emitting part 400 and the second electrode 220, a fourth emitting part 600 disposed between the third emitting part 500 and the second electrode 220, a first charge generation layer (CGL1) 370 disposed between the first emitting part 300 and the second emitting part 400, a second charge generation layer (CGL2) 470 disposed between the second emitting part 400 and the third emitting part 500, and a third charge generation layer (CGL3) 570 disposed between the third emitting part 500 and the fourth emitting part 600.

The first emitting part 300 includes a first emitting material layer (EML1) 340. The first emitting part 300 may include at least one of a hole injection layer (HTL) 310 disposed between the first electrode 210 and the EML1 340, a first hole transport layer (HTL1) 320 disposed between the HIL 310 and the EML1 340, and a first electron transport layer (ETL1) 350 disposed between the EML1 340 and the CGL1 370.

The second emitting part 400 includes a second emitting material layer (EML2) 440. The second emitting part 400 may include at least one of a second hole transport layer (HTL2) 420 disposed between the CGL1 370 and the EML2 440, a third hole transport layer (HTL3) 430 disposed between the HTL1 420 and the EML2 440, and a second electron transport layer (ETL2) 450 disposed between the EML2 440 and the CGL2 470.

The third emitting part 500 includes a third emitting material layer (EML3) 540. The third emitting part 500 may include at least one of a fourth hole transport layer (HTL4) 520 disposed between the CGL2 470 and the EML3 540 and a third electron transport layer (ETL3) 550 disposed between the EML3 540 and the CGL3 570.

The fourth emitting part 600 includes a fourth emitting material layer (EML4) 640. The fourth emitting part 600 may include at least one of a fifth hole transport layer (HTL5) 620 disposed between the CGL3 570 and the EML4 640, a sixth hole transport layer (HTL6) 630 disposed between the HTL5 620 and the EML4 640, a fourth electron transport layer (ETL4) 650 disposed between the EML4 640 and the second electrode 220, and an electron injection layer (EIL) 660 disposed between the ETL4 650 and the second electrode 220.

In one aspect, two of the EML1 to EML4 340, 440, 540 and 640 emit blue color light, one of the EML1 to EML4 340, 440, 540 and 640 emits green color light and another one of the EML1 to EML4 340, 440, 540 and 640 emits red color light so that the OLED D may implement white color emission. Hereinafter, the OLED D where the EML1 340 emits red color light, the EML2 440 and the EML4 640 emit blue color light and the EML3 540 emits green color light will be described in more detail.

The HIL 310 is disposed between the first electrode 210 and the HTL1 320 and may improve an interface property between the inorganic first electrode 210 and the organic HTL1 320. In one aspect, hole injecting material in the HIL 310 may include, but is not limited to, 4, 4', 4"-Tris (3-methylphenylamino) triphenylamine (MTDATA), 4, 4', 4"-Tris (N, N-diphenyl-amino) triphenylamine (NATA), 4, 4', 4"-Tris (N-(naphthalene-1-yl)-N-phenyl-amino) triphenylamine (1T-NATA), 4, 4', 4"-Tris (N-(naphthalene-2-yl)-N-phenyl-amino) triphenylamine (2T-NATA), Copper phthalocyanine (CuPc), Tris (4-carbazoyl-9-yl-phenyl) amine (TCTA), N, N'-Diphenyl-N, N'-bis (1-naphthyl)-1, 1'-biphenyl-4, 4"-diamine (NPB; NPD), N, N'-Bis {4-[bis (3-methylphenyl) amino]phenyl}-N, N'-diphenyl-4, 4'-biphenyldiamine (DNTPD), 1, 4, 5, 8, 9, 11-Hexaazatriphenylenehexacarbonitrile (Dipyrazino [2, 3-f: 2'3'-h]quinoxaline-2, 3, 6, 7, 10, 11-hexacarbonitrile; HAT-CN), 2, 3, 5, 6-Tetrafluoro-7, 7, 8, 8-tetracyano-quinodimethane (F4-TCNQ), 1, 3, 4, 5, 7, 8-hexafluoro-tetracyano-naphthoquinodimethane (F6-TCNNQ), 1, 3, 5-tris [4-(diphenylamino) phenyl]benzene (TDAPB), poly (3, 4-ethylenedioxythiphene) polystyrene sulfonate (PEDOT/PSS), N-(biphenyl-4-yl)-9, 9-dimethyl-N-(4-(9-phenyl-9H-carbazol-3-yl) phenyl)-9H-fluoren-2-amine, N, N'-diphenyl-N, N'-di [4-(N, N'-diphenyl-amino) phenyl]benzidine (NPNPB), Di-[4-(N, N-di-p-tolyl-amino)-phenyl]cyclohexane (TAPC), N4, N4, N4', N4'-Tetra [(1, 1'-biphenyl)-4-yl]-(1, 1'-biphenyl)-4, 4'-diamine (BPBPA), the organic compound of the following Chemical Formula 1 and/or combinations thereof.

[Chemical Formula 1]

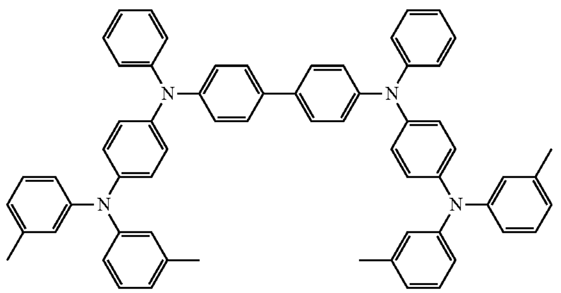

In another aspect, the HIL 310 may include hole transporting material described below doped with the above hole injecting material (e. g., organic material such as HAT-CN, F4-TCNA and/or F6-TCNNQ). In this case, the contents of the hole injecting material in the HIL 310 may be, but is not limited to, about 1 wt % to about 50 wt %, for example, about 5 wt % to about 50 wt %. For example, the HIR 310 may have a thickness, but is not limited to, between about 50 Å and about 200 Å. In certain aspects, the HIL 310 may be omitted in according to the property of the OLED D1.

Each of the HTL1 320, the HTL2 and HTL3 420 and 430, the HTL4 520, and the HTL5 and HTL6 620 and 630 transports holes to the EML1 340, the EML2 440, the EML3 540 and the EML4 640, respectively. In one aspect, the hole transporting material in the HTL1 to HTL6 320, 420, 430, 520, 620 and 630 may independently include, but is not limited to, N, N'-Diphenyl-N, N'-bis (3-methylphenyl)-1, 1'-biphenyl-4, 4'-diamine (TPD), NPB (NPD), 4, 4'-bis (N-carbazolyl)-1, 1'-biphenyl (CBP), DNTPD, BPBPA, NPNPB, Poly [N, N'-bis (4-butylphenyl)-N, N'-bis (phenyl)-benzidine] (Poly-TPD), Poly [(9, 9-dioctylfluorenyl-2, 7-diyl)-co-(4, 4'-(N-(4-sec-butylphenyl) diphenylamine))] (TFB), TAPC, 3, 5-Di (9H-carbazol-9-yl)-N, N-diphenylaniline (DCDPA), N-(biphenyl-4-yl)-9, 9-dimethyl-N-(4-(9-phenyl-9H-carbazol-3-yl) phenyl)-9H-fluoren-2-amine, N-(biphenyl-4-yl)-N-(4-(9-phenyl-9H-carbazol-3-yl) phenyl) biphenyl-4-amine, N-([1, 1'-Biphenyl]-4-yl)-9, 9-dimethyl-N-(4-(9-phenyl-9H-carbazol-3-yl) phenyl)-9H-fluoren-2-amine and/or combinations thereof. In another example, the HTL2 420 may include high refractive material described below.

In another aspect, each of the HTL3 430 and the HTL6 630 disposed adjacently to each of the EML2 440 and the EML4 640, each of which may be the blue emitting material layer, respectively, may act as electron blocking together with or instead of the hole transporting function. When the HTL3 430 and the HTL6 630 have the electron blocking function, electron blocking material in each of the HTL3 430 and the HTL6 630 may independently include, but is not limited to, TCTA, tris [4-(diethylamino) phenyl]amine, N-(biphenyl-4-yl)-9, 9-dimethyl-N-(4-(9-phenyl-9H-carbazol-3-yl) phenyl)-9H-fluoren-2-amine, TAPC, MTDATA, 1, 3-Bis (carbazol-9-yl) benzene (mCP), 3, 3-Di (9H-carbazol-9-yl) biphenyl (mCBP), CuPc, DNTPD, TDABP, DCDPA, 2, 8-bis (9-phenyl-9H-carbazol-3-yl) dibenzo [b, d]thiophene and/or combinations thereof.

In one example aspect, the HTL1 320 may have a thickness in a range between about 150 Å and about 250 Å, each of the HTL 3 and HTL4 430 and 520 may have a thickness in a range between about 250 Å and about 350 Å, the HTL5 620 may have a thickness in a range between about 650 Å and about 750 Å, and/or the HTL6 630 may have a thickness in a range between about 100 Å and about 200 Å, but is not limited thereto.

Each of the ETL1 350, the ETL2 450, the ETL3 550 and the ETL4 650 transports electrons to the EML1 340, the EML2 440, the EML3 540 and the EML4 640, respectively. In one aspect, electron transporting material in the ETL1 to ETL4 350, 450, 550 and 650 may independently include at least one of an oxadiazole-based compound, a triazole-based compound, a phenanthroline-based compound, a benzoxazole-based compound, a benzothiazole-based compound, a benzimidazole-based compound, and a triazine-based compound.

For example, the electron transporting material in the ETL1 to ETL4 350, 450, 550 and 650 may independently include, but is not limited to, tris-(8-hydroxyquinoline) aluminum ($Alq_3$), 2-biphenyl-4-yl-5-(4-t-butylphenyl)-1,3,4-oxadiazole (PBD), spiro-PBD, lithium quinolate (Liq), 2,2', 2"-(1,3,5-benzenetriyl)-tris(1-phenyl-1-H-benzimidazole) (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-((N,N-dimethyl)-N-ethylammonium)-propyl)-2,7-fluorene]-alt-2,7-(9,9-dioctylfluorene)] dibromide (PFNBr), tris(phenylquinoxaline) (TPQ), TSPO1, 2-[4-(9,10-Di-2-naphthalen2-yl-2-anthracen-2-yl) phenyl]-1-phenyl-1H-benzimidazole (ZADN), and/or combinations thereof.

In another aspect, the electron transporting material in the ETL1 350 may include high refractive material described below.

As an example, the ETL2 450 may have a thickness in a range between about 50 Å and about 150 Å, for example, about 100 Å and about 150 Å, and each of the ETL3 550 and the ETL4 650 may independently have a thickness in a range between about 150 Å and about 300 Å, for example, about 200 Å and about 250 Å, but is not limited thereto.

The EIL 660 is disposed between the second electrode 220 and the ETL4 650, and may improve physical properties of the second electrode 220 and therefore, may enhance the lifespan of the OLED D. In one aspect, electron injecting material in the EIL 660 may include, but is not limited to, an alkali metal halide and/or an alkaline earth metal halide such as LiF, CsF, NaF, $BaF_2$ and the like, and/or an organometallic Compound such as Liq, lithium benzoate, sodium stearate, and the like. In certain aspects, the EIL 660 may be omitted.

In another aspect, the ETL4 650 and the EIL 660 may have a single layered structure. In this case, the above electron transporting material and/or the electron injecting material may be mixed with each other. As an example, the ETL4 650/EIL 660 may include two or more different electron transporting materials. For example, two electron transporting materials in the ETL/EIL are admixed with a weight ratio of about 3:7 to about 7:3, but is not limited thereto.

The EML1 340 may be a red emitting material layer. The EML1 340 may include a red host and a red emitter (red dopant). The red host may include at least one of a P-type red host and an N-type red host. The P-type red host may include, but is not limited to, a carbazole-based organic compound, an amine-based organic compound substituted with aryl and/or hetero aryl and/or a spirofluorene-based organic compound. The N-type red host may include, but is not limited to, an azine-based organic compound, a quinazoline-based organic compound and/or a quinoxaline-based organic compound.

For example, the red host may include, but is not limited to, CBP, mCBP, 2, 2'-Di (9H-carbazol-9yl)-1, 1'-biphenyl (oCBP), mCP, 9-(3-(9H-carbazol-9-yl) phenyl)-9H-carbazole-3-carbonitrile (mCP-CN), Bis [2-(diphenylphosphino) phenyl]ether oxide (DPEPO), 2, 8-bis (diphenylphosphoryl) dibenzothiophene (PPT), 1, 3, 5-Tris [(3-pyridyl)-phen-3-yl]benzene (TmPyPB), 2, 6-Di (9H-carbazol-9-yl) pyridine (PYD-2Cz), 2, 8-di (9H-carbazol-9-yl) dibenzothiophene (DCzDBT), 3', 5'-Di (carbazol-9-yl)-[1, 1'-biphenyl]-3, 5-dicarbonitrile (DCzTPA), 4'-(9H-carbazol-9-yl) biphenyl-3, 5-dicarbonitrile (pCzB-2CN), 3'-(9H-carbazol-9-yl) biphenyl-3, 5-dicarbonitrile (mCzB-2CN), TSPO1, 9-(9-phenyl-9H-carbazol-6-yl)-9H-carbazole (CCP), 4-(3-(triphenylen-2-yl) phenyl) dibenzo [b, d]thiophene, 9-(4-(9H-carbazol-9-yl) phenyl)-9H-3, 9'-bicarbazole, 9-(3-(9H-carbazol-9-yl) phenyl)-9H-3, 9'-bicarbazole, 9-(6-(9H-carbazol-9-yl) pyridin-3-yl)-9H-3, 9'-bicarbazole, 9, 9'-Diphenyl-9H, 9'H-3, 3'-bicarbazole (BCzPh), 1, 3, 5-Tris (carbazol-9-yl) benzene (TCP), TCTA, 4, 4'-Bis (carbazole-9-yl)-2, 2'-dimethylbiphenyl (CDBP), 2, 7-Bis (carbazole-9-yl)-9, 9-dimethylfluorene (DMFL-CBP), 2, 2', 7, 7'-Tetrakis (carbazol-9-yl)-9, 9-spirofluorene (Spiro-CBP), 3, 6-Bis (carbazole-9-yl)-9-(2-ethyl-hexyl)-9H-carbazole (TCzl), BPBPA, 1, 3, 5-Tris (N-phenylbenzimidazol-2-yl) benzene (TPBi), TCTA and/or combinations thereof.

The red emitter may include at least one of red phosphorescent material, red fluorescent material and red delayed fluorescent material. In one aspect, the red emitter may include, but is not limited to, Bis [2-(4, 6-dimethyl) phenylquinoline] (2, 2, 6, 6-tetramethylheptane-3, 5-dionate) iridium (III), Bis [2-(4-n-hexylphenyl) quinoline] (acetylacetonate) iridium (III) (Hex-Ir $(phq)_2$(acac)), Tris[2-(4-n-hexylphenyl)quinoline]iridium(III) (Hex-Ir$(phq)_3$), Tris[2-phenyl-4-methylquinoline]iridium(III) (Ir$(Mphq)_3$), Bis(2-phenylquinoline)(2,2,6,6-tetramethylheptene-3,5-dionate) iridium(III) (Ir(dpm)$PQ_2$), Tris(1-phenylisoquinoline) iridium(III) (Ir$(piq)_3$), Bis(phenylisoquinoline)(2,2,6,6-tetramethylheptene-3,5-dionate)iridium(III) (Ir(dpm) $(piq)_2$), Bis(1-phenylisoquinoline)(acetylacetonate)iridium (III) (Ir$(piq)_2$(acac)), Bis[(4-n-hexylphenyl)isoquinoline] (acetylacetonate)iridium(III) (Hex-Ir$(piq)_2$(acac)), Tris[2-(4-n-hexylphenyl)quinoline]iridium(III) (Hex-Ir$(piq)_3$), Tris (2-(3-methylphenyl)-7-methyl-quinolato)iridium (Ir$(dmpq)_3$), Bis[2-(2-methylphenyl)-7-methyl-quinoline] (acetylacetonate)iridium(III) (Ir$(dmpq)_2$(acac)), Bis[2-(3,5-dimethylphenyl)-4-methyl-quinoline](acetylacetonate) iridium(III) (Ir$(mphmq)_2$(acac)), Tris(dibenzoylmethane) mono(1,10-phenanthroline)europium(III) (Eu$(dbm)_3$(phen)) and/or combinations thereof.

The contents of the red host in the EML1 340 may be in a range between about 50 wt % and about 99 wt %, for example, about 80 wt % and about 95 wt %, and the contents of the red emitter in the EML1 340 may be in a range between about 1 wt % and about 50 wt %, for example, about 5 wt % and about 20 wt %, but is not limited thereto. When the EML1 340 includes both the P-type red host and the N-type red host, the P-type red host and the N-type red host may be mixed, but is not limited to, with a weight ratio between about 4:1 to about 1:4, for example, about 3:1 to 1:3. In one embodiment, the EML1 340 may have a thickness, but is not limited to, in a range between about 100 Å and about 300 Å, for example, about 150 Å and about 200 Å.

The EML2 440 and the EML4 640 may be a first blue emitting material layer and a second blue emitting material layer, respectively. Each of the EML2 440 and the EML4 640 may be a blue EML, a sky-blue EML or a deep-blue EML. Each of the EML2 440 and the EML4 640 may include a blue host and a blue emitter (blue dopant).

The blue host may include at least one of a P-type blue host and an N-type blue host. The P-type blue host may include, but is not limited to, a carbazole-based organic compound, an amine-based organic compound substituted with aryl and/or hetero aryl and/or a spirofluorene-based organic compound. The N-type blue host may include, but is not limited to, an azine-based organic compound.

In one aspect, the blue host may include, but is not limited to, mCP, mCP-CN, mCBP, CBP-CN, 9-(3-(9H-Carbazol-9-yl) phenyl)-3-(diphenylphosphoryl)-9H-carbazole (mCPPO1) 3, 5-Di (9H-carbazol-9-yl) biphenyl (Ph-mCP), Diphenyl-4-triphenylsilyl-phenylphosphine oxide (TSPO1), 9-(3'-(9H-carbazol-9-yl)-[1, 1'-biphenyl]-3-yl)-9H-pyrido [2, 3-b]indole (CzBPCb), Bis (2-methylphenyl) diphenylsilane (UGH-1), 1, 4-Bis (triphenylsilyl) benzene (UGH-2), 1, 3-Bis (triphenylsilyl) benzene (UGH-3), 9, 9-Spiorobifluoren-2-yl-diphenyl-phosphine oxide (SPPO1), 9, 9'-(5-(Triphenylsilyl)-1, 3-phenylene) bis (9H-carbazole) (SimCP), 9, 10-di (naphthalen-2-yl) anthracene (ADN), 2-methyl-9, 10-bis (naphthalen-2-yl) anthracene (MADN) and/or combinations thereof.

The blue emitter may include at least one of blue phosphorescent material, blue fluorescent material and blue delayed fluorescent material. In one aspect, the blue emitter may include, but is not limited to, perylene, 4, 4'-Bis [4-(di-p-tolylamino) styryl]biphenyl (DPAVBi), 4-(Di-p-tolylamino)-4-4'-[(di-p-tolylamino) styryl]stilbene (DPAVB), 4, 4'-Bis [4-(diphenylamino) styryl]biphenyl (BDAVBi), 2, 7-Bis (4-diphenylamino) styryl)-9, 9-spirofluorene (spiro-DPVBi), [1, 4-bis [2-[4-[N, N-di (p-tolyl) amino]phenyl]vinyl]benzene (DSB), 1-4-di-[4-(N, N-diphenyl) amino]styryl-benzene (DSA), 2, 5, 8, 11-Tetra-tetr-butylperylene (TBPe), Bis ((2-hydroxylphenyl)-pyridine) beryllium (Bepp$_2$), 9-(9-Phenylcarbazol-3-yl)-10-(naphthalen-1-yl)anthracene (PCAN), mer-Tris(1-phenyl-3-methylimidazolin-2-ylidene-C,C(2))'iridium(III) (mer-Ir$(pmi)_3$), fac-Tris(1,3-diphenyl-benzimidazolin-2-ylidene-C,C(2)) 'iridium(III) (fac-Ir$(dpbic)_3$), Bis(3,4,5-trifluoro-2-(2-pyridyl)phenyl-(2-carboxypyridyl))iridium(III) (Ir$(tfpd)_2$ pic), tris(2-(4,6-difluorophenyl)pyridine)iridium(III) (Ir $(Fppy)_3$), Bis[2-(4,6-difluorophenyl)pyridinato-$C^2$,N](picolinato)iridium(III) (FIrpic), DABNA-1, DABNA-2, t-DABNA, v-DABNA and/or combinations thereof.

The blue host in the EML2 440 may be identical to or different from the blue host in the EML4 640. The blue emitter in the EML2 440 may be identical to or different from the blue emitter in the EML4 640.

The contents of the blue host in the EML2 and EML4 440 and 640 may be in a range between about 50 wt % and about 99 wt %, for example, about 80 wt % and about 95 wt %, and the contents of the red emitter in the EML2 and EML4 440 and 640 may be in a range between about 1 wt % and about 50 wt %, for example, about 5 wt % and about 20 wt %, but is not limited thereto. When the EML2 and EML4 440 and 640 includes both the P-type red host and the N-type red host, the P-type red host and the N-type red host may be mixed, but is not limited to, with a weight ratio between about 4:1 to about 1:4, for example, about 3:1 to 1:3. In one embodiment, each of the EML2 440 and the EML4 640 may have a thickness, but is not limited to, in a range between about 200 Å and about 400 Å, for example, about 250 Å and about 350 Å.

The EML3 540 may be a green emitting material layer. The EML3 540 may include a green host and a green emitter (green dopant). The green host may include at least one of a P-type green host and an N-type green host. The P-type green host may include, but is not limited to, a carbazole-based organic compound, an amine-based organic compound substituted with aryl and/or hetero aryl and/or a spirofluorene-based organic compound. The N-type green host may include, but is not limited to, an azine-based organic compound.

In one aspect, the green host include, but is not limited to, mCP-CN, CBP, mCBP, mCBP, DPEPO, PPT, TmPyPB, PYD-2Cz, DCzDBT, DCzTPA, pCzB-2CN, mCzB-2CN, TSPO1, CCP, 4-(3-(triphenylen-2-yl) phenyl) dibenzo [b, d]thiophene, 9-(4-(9H-carbazol-9-yl) phenyl)-9H-3, 9'-bicarbazole, 9-(3-(9H-carbazol-9-yl) phenyl)-9H-3, 9'-bicarbazole, 9-(6-(9H-carbazol-9-yl) pyridin-3-yl)-9H-3, 9'-bicarbazole, BCzPh, TCP, TCTA, CDBP, DMFL-CBP, Spiro-CBP, TCzl and/or combinations thereof.

The green emitter may include at least one of green phosphorescent material, green fluorescent material and green delayed fluorescent material. In one aspect, the green emitter may include, but is not limited to, [Bis (2-phenylpyridine)] (pyridyl-2-benzofuro [2, 3-b]pyridine) iridium, Tris [2-phenylpyridine]iridium (III) (Ir $(ppy)_3$), fac-Tris(2-phenylpyridine)iridium(III) (fac-Ir$(ppy)_3$), Bis(2-phenylpyridine)(acetylacetonate)iridium(III) (Ir$(ppy)_2$ (acac)), Tris[2-(p-tolyl)pyridine]iridium(III) (Ir$(mppy)_3$), Bis(2-(naphthalene-2-yl)pyridine)(acetylacetonate)iridium (III) ($Ir(npy)_2acac$), Tris(2-phenyl-3-methyl-pyridine)iidium ($Ir(3mppy)_3$), fac-Tris(2-(3-p-xylyl)phenyl)pyridine iridium (III) (TEG) and/or combinations thereof.

The contents of the green host in the EML3 540 may be in a range between about 50 wt % and about 99 wt %, for example, about 80 wt % and about 95 wt %, and the contents of the green emitter in the EML3 540 may be in a range between about 1 wt % and about 50 wt %, for example, about 5 wt % and about 20 wt %, but is not limited thereto. When the EML3 540 includes both the P-type green host and the N-type green host, the P-type green host and the N-type green host may be mixed, but is not limited to, with a weight ratio between about 4:1 to about 1:4, for example, about 3:1 to 1:3. In one embodiment, the EML3 540 may have a thickness, but is not limited to, in a range between about 200 Å and about 400 Å, for example, about 250 Å and about 350 Å.

The CGL1 370 includes a first N-type charge generation layer (N-CGL1) 375 disposed between the ETL1 350 and the HTL2 420 and a first P-type charge generation layer (P-CGL1) 380 disposed between the N-CGL1 375 and the HTL2 420. In one aspect, the N-CGL1 375 may have a thickness in a range between about 150 Å and about 250 Å, for example, about 150 Å and about 200 Å, and/or the P-CGL1 380 may have a thickness in a range between about 50 Å and about 150 Å, for example, about 50 Å and about 100 Å, but is not limited thereto.

The CGL2 470 includes a second N-type charge generation layer (N-CGL2) 475 disposed between the ETL2 450 and the HTL4 520 and a second P-type charge generation layer (P-CGL2) 480 disposed between the N-CGL2 475 and the HTL4 520. In one aspect, the N-CGL2 475 may have a thickness in a range between about 100 Å and about 200 Å, for example, about 100 Å and about 150 Å, and/or the P-CGL2 480 may have a thickness in a range between about 30 Å and about 100 Å, for example, about 40 Å and about 80 Å, but is not limited thereto.

The CGL3 570 includes a third N-type charge generation layer (N-CGL3) 575 disposed between the ETL3 550 and the HTL5 620 and a third P-type charge generation layer (P-CGL3) 580 disposed between the N-CGL3 575 and the HTL5 620. In one aspect, the N-CGL2 575 may have a thickness in a range between about 100 Å and about 300 Å, for example, about 150 Å and about 250 Å, and/or the P-CGL3 580 may have a thickness in a range between about 50 Å and about 150 Å, for example, about 80 Å and about 150 Å, but is not limited thereto.

Each of the N-CGL1 375, the N-CGL2 475 and the N-CGL3 575 provides electrons to the EML1 340 in the first emitting part 300, the EML2 440 in the second emitting part 400 and the EML3 540 in the third emitting part 500, respectively. Each of the P-CGL1 380, the P-CGL2 485 and the P-CGL3 580 provides holes to the EML2 440 in the second emitting part 500, the EML3 540 in the third emitting part 500 and the EML4 640 in the fourth emitting part 600, respectively.

Each of the N-CGL1 375, the N-CGL2 475 and the N-CGL3 575 may be an organic layer including electron transporting material doped with an alkali metal such as Li, Na, K and Cs and/or an alkaline earth metal such as Mg, Sr, Ba and Ra. For example, the contents of the alkali metal and/or the alkaline earth metal in each of the N-CGL1 375, the N-CGL2 475 and the N-CGL3 575 may be, but is not limited to, between about 0.1 wt % and about 30 wt %, for example, about 1 wt % and about 10 wt %.

In one aspect, each of the P-CGL1 380, the P-CGL2 480 and the P-CGL3 580 may include, but is not limited to, inorganic material selected from the group consisting of $WO_x$, $MoO_x$, $Be_2O_3$, $V_2O_5$ and/or combinations thereof. In another aspect, each of the P-CGL1 380, the P-CGL2 480 and the P-CGL3 580 may include organic material of the hole transporting material doped with the hole injecting material (e. g., organic material such as HAT-CN, F4-TCNQ and/or F6-TCNNQ and/or inorganic material such as $MgF_2$ and $CaF_2$). In this case, the contents of the hole injecting material in the P-CGL1 380, the P-CGL2 480 and the P-CGL3 580 may be, but is not limited to, between about 2 wt % and about 15 wt %.

As described above, at least one of the ETL1 350 in the first emitting part 300 and the HTL2 420 spaced apart from the EML2 440 in the second emitting part 400 may include high refractive material. For example, at least one of the ETL1 350 and the HTL2 420 may include material having a refractive index in a range between about 1.9 and about 2.1.

For example, the high refractive material in the HTL2 420 include an organic compound that includes a xanthene moiety or a thioxanthene moiety forming a spiro structure with a fluorene ring or a benzofluorene ring, and an aryl- and/or heteroaryl-amine group substituted to a non-spiro benzene ring of the spiro-structured fluorene ring or benzofluorene ring. Such high refractive material having physiochemical properties such as amorphous property and/or high refractive property in the HTL2 420 may cause the luminous efficiency of the OLED D to be improved. For example, the high refractive material that may be applied into the HTL2 420 may include an organic compound disclosed Korean Patent No. 2, 100, 581, which is incorporated herein by reference into the present application.

The high refractive material in the ETL1 350 may include a phenanthroline-based organic compound and/or a trizole-based organic compound. For example, the high refractive material in the ETL1 350 may include, but is not limited to, BCP, Bphen, NBphen, 2-(naphthalene-2-yl)-4, 7-diphenyl-1, 10-phenanthroline (HNBphen), TAZ, TmPPPyTz, 2-(biphenyl-4-yl)-4, 6-bis (4'-(pyridine-2-yl) biphenyl-4-yl)-1, 3, 5-triazine (DPyBPTz), Liq, BAlq and/or combinations thereof.

In one aspect, the HTL2 420 may have a refractive index, but is not limited to, in a range between about 1.9 and about 2.0. In another aspect, the HTL2 420 may have a thickness T2, but is not limited to, in a range between about 400 Å and about 470 Å, for example, about 420 Å and about 450 Å.

In another aspect, the ETL1 350 may have a refractive index, but is not limited to, in a range between about 1.9 and about 1.95. In another aspect, the ETL1 350 may have a thickness T1, but is not limited to, in a range between about 650 Å and about 800 Å, for example, about 700 Å and about 750 Å.

In another aspect, each of the HTL2 420 and the ETL1 350 may independently have a refractive index, but is not limited to, in a range between about 1.9 and about 2.0. In another embodiment, the HTL2 420 may have the thickness T2 in a range between about 370 Å and about 570 Å, for example, about 420 Å and about 520 Å, and the ETL1 350 may have the thickness T1 in a range between about 100 Å and about 300 Å, for example, about 150 Å and about 250 Å, but is not limited thereto.

The ETL1 350 transporting electrons to the EML1 340 and/or the HTL2 420 transporting holes to the EML2 440 in the OLED D with plural emitting parts includes the high refractive material so that the blue light luminous efficiency and the white light luminance emitted from the OLED D may be improved. With comparing to the OLED with only low refractive material, in the OLED with high refractive material, color coordinate may be maintained stably and sufficient color viewing angle may be sufficiently secured. In addition, the OLED D has a tandem structure with plural emitting parts so that the OLED D2 with improved luminous efficiency and white light may be implemented.

Example 1 (Ex. 1): Design of OLED

An organic light emitting diode of four emitting parts having the following stacked structure and setting the refractive index of HTL to 2.0 at 460 nm and the refractive indices of other layers to 1.83 at 460 nm was designed.

Anode (ITO, 500 Å); hole injection layer (HIL, 70 Å); a first hole transport layer (HTL1, 200 Å); red emitting material layer (R-EML, 200 Å); first electron transport layer (ETL1, 100 Å); first N-type charge generation layer (N-CGL1, 170 Å); first P-type charge generation layer (P-CGL1, 75 Å); second hole transport layer (HTL2, 470 Å); third hole transport layer (HTL3, 550 Å); first blue emitting material layer (B-EML1, 200 Å); second electron transport layer (ETL2, 110 Å); second N-type charge generation layer (N-CGL2, 120 Å); second P-type charge generation layer (P-CGL2, 65 Å); fourth hole transport layer (HTL4, 260 Å); green emitting material layer (G-EML, 300 Å), third electron transport layer (ETL3, 220 Å); third N-type charge generation layer (N-CGL3, 110 Å); third P-type charge generation layer (P-CGL3, 110 Å); fifth hole transport layer (HTL5, 670 Å); sixth hole transport layer (HTL6, 150 Å); second blue emitting material layer (B-EML2, 300 Å); fourth electron transport layer (ETL4, 230 Å), an electron injection layer (EIL, 13.5 Å); and cathode (Al, 1500 Å).

Example 2 (Ex. 1): Design of OLED

An OLED was designed using the same structure as Example 1, except that the refractive index of the HTL2 was set to 1.83 at 460 nm, the thicknesses of the HTL2 and the HTL3 were modified to have 270 Å and 150 Å, respectively, the refractive index of the ETL1 was set to 2.01 at 460 nm, and the thickness of the ETL1 was modified to have 700 Å.

Comparative Example 1 (Ref. 1): Design of OLED

An OLED was designed using the same structure as Example 1, except that the thickness of ITO was modified to have 1100 Å, the thickness of the HTL1 was modified to have 900 Å, the thickness of the ETL1 was modified to have 200 Å, the thicknesses of the HTL2 and the HTL3 were modified to have 770 Å and 150 Å, respectively, and the refractive indices in all layers including the HTL2 was set to 1.83 at 460 nm.

Comparative Example 2 (Ref. 2): Design of OLEDs

An OLED was designed using the same structure as Comparative Example 1, except that addition hole transport layer (700 Å) with setting to have a refractive index of 2.10 at 460 nm was further stacked between the HTL1 and the HIL, wherein the addition hole transport layer may be taken as a part of the HTL1.

Experimental Example 1: Measurement of Luminous Properties of OLEDs

The luminous or optical properties for each of the OLEDs, designed in Examples 1-2 and Comparative Examples 1-2 were evaluated through a simulation experiment. The current efficiency (cd/A) of blue light, color coordinate (CIE1932, Bx, By) of blue light and white light luminance (relative value) were evaluated. The evaluation results are indicated in the following Table 1 and FIG. 4.

TABLE 1

| Luminous Properties of OLED | | | | | |
|---|---|---|---|---|---|
| Sample | High Refractive Layer | cd/A | Bx | By | W luminance (%) |
| Ref. 1 | — | 3.8 | 0.147 | 0.041 | 100 |
| Ref. 2 | HTL1 | 4.1 | 0.147 | 0.041 | 107 |
| Ex. 1 | HTL2 | 4.5 | 0.147 | 0.041 | 117 |
| Ex. 2 | ETL1 | 4.5 | 0.146 | 0.042 | 116 |

Figure 4:
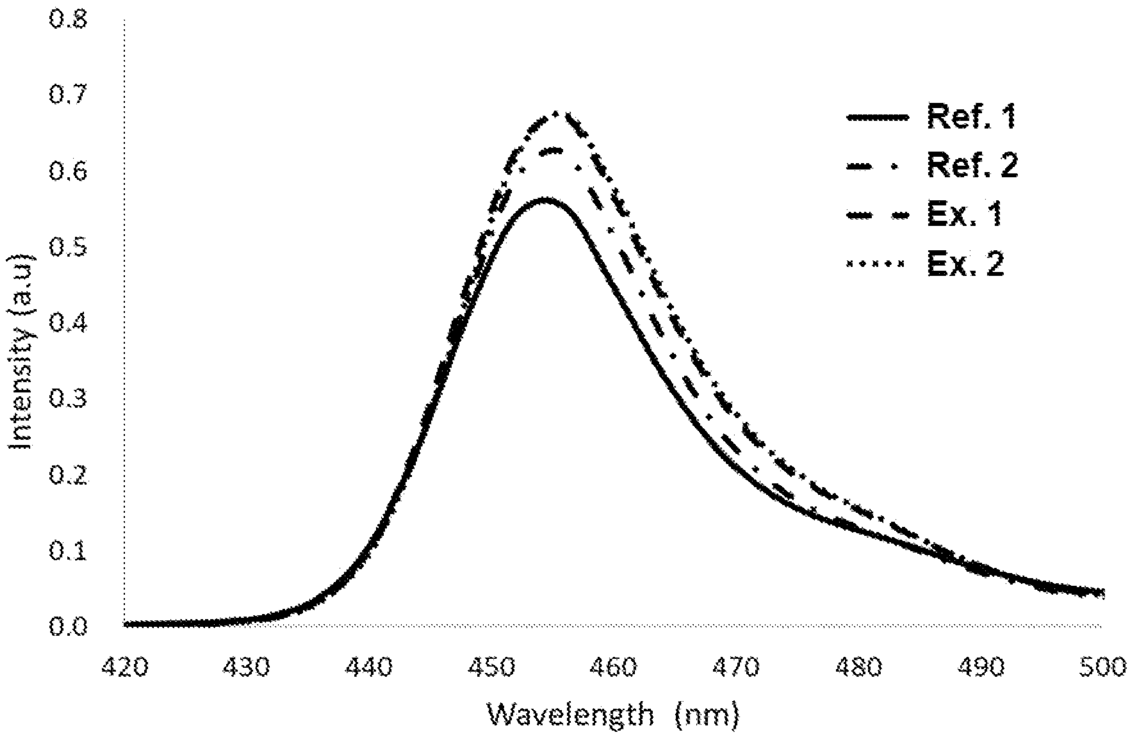
FIGS. 4 and 5 illustrate a graph of showing the intensities of luminous spectra in an organic light emitting diode evaluated in Example or Comparative Example.

ITO thickness in Ref. 1 and Ref. 2: 1100 Å;
ITO thickness in Ex. 1 and Ex. 2: 500 Å;

As indicated in Table 1 and FIG. 4, compared to the OLEDs designed in Comparative Example 1 where no high refractive material are not included and in Comparative Example 2 where the HTL 1 in the first emitting part includes high refractive material, in the OLEDs designed in Examples 1-2 where the ETL1 or the HTL2 includes high refractive material, the blue light current efficiency, the white light luminance and the intensity of electro luminescence (EL) were significantly improved. The blue color coordinates were maintained with introducing the high refractive material.

Comparative Example 3 (Ref. 3): Design of OLEDs

An OLED was designed using the same structure as Example 1, except that the refractive indices of the entire layers including the HTL2 in the emissive layer were set to 1.83 at 460 nm.

Comparative Examples 4-11 (Ref 4-11): Design of OLEDs

An OLED was designed using the same structure as Comparative Example 3, except that the refractive index of one common layer was set to have 2.01 at 460 nm as indicated in Table 2 below.

Experimental Example 2: Measurement of Luminous Properties of OLEDs

The luminous or optical properties for each of the OLEDs, designed in Examples 1-2 and Comparative Examples 3-11 were evaluated through a simulation experiment as Experimental Example 2. The evaluation results are indicated in the following Table 2 and FIG. 5.

TABLE 2

| Luminous Properties of OLED | | | | |
|---|---|---|---|---|
| Sample | High Refractive Layers | cd/A | Bx | By |
| Ref. 3 | — | 4.2 | 0.147 | 0.041 |
| Ref. 4 | HTL1 | 4.0 | 0.147 | 0.042 |

TABLE 2-continued

| Luminous Properties of OLED | | | | |
|---|---|---|---|---|
| Sample | High Refractive Layers | cd/A | Bx | By |
| Ref. 5 | HTL3 | 4.1 | 0.146 | 0.043 |
| Ref. 6 | ETL2 | 4.1 | 0.147 | 0.041 |
| Ref. 7 | HTL4 | 4.1 | 0.147 | 0.041 |
| Ref. 8 | ETL3 | 4.2 | 0.147 | 0.042 |
| Ref. 9 | HTL5 | 4.1 | 0.147 | 0.042 |
| Ref. 10 | HTL6 | 4.1 | 0.147 | 0.043 |
| Ref. 11 | ETL4 | 4.1 | 0.147 | 0.042 |
| Ex. 1 | HTL2 | 4.5 | 0.147 | 0.041 |
| Ex. 2 | ETL1 | 4.5 | 0.146 | 0.042 |

Figure 5:
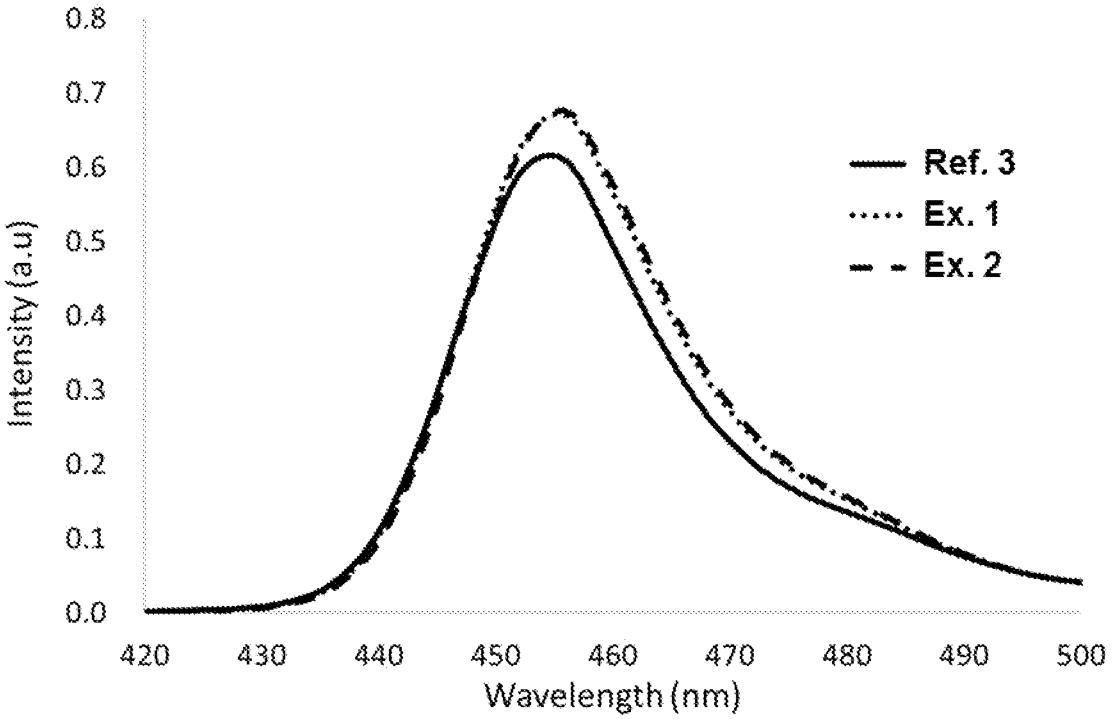

As indicated in Table 2 and FIG. 5, compared to the OLEDs designed in Comparative Examples 3-11 where no high refractive material are not included or a common layer other than the ETL1 or the HTL2 includes high refractive material, in the OLEDs designed in Examples 1-2 where the ETL1 or the HTL2 includes high refractive material, the blue light current efficiency and the intensity of electro luminescence (EL) were significantly improved.

Experimental Example 3: Measurement of Luminous Properties of OLEDs by HTL2 Refractive Index An OLED was designed using the same structure as Example 1, except that the refractive indices (at 460 nm) of the HTL2 were modified as illustrated in Table 3 below. The luminous properties or optical properties such as the blue luminous efficiency, color coordinate and color viewing angle [Δ u'v' ] at 600 were evaluated as Experimental Example 1. The evaluation results are indicated in the following Table 3.

TABLE 3

| Luminous Properties of OLED | | | | | |
|---|---|---|---|---|---|
| Sample | HTL2 Refractive Index | cd/A | Bx | By | [Δ u'v'] |
| Ref. | 1.84 | 4.2 | 0.147 | 0.041 | 0.014 |
| 1 | 1.90 | 4.4 | 0.146 | 0.042 | 0.016 |
| 2 | 1.95 | 4.4 | 0.146 | 0.042 | 0.018 |
| 3 | 2.00 | 4.5 | 0.146 | 0.041 | 0.018 |
| 4 | 2.05 | 4.5 | 0.146 | 0.041 | 0.020 |
| 5 | 2.10 | 4.6 | 0.146 | 0.041 | 0.021 |

As indicated in Table 3, when the refractive index of the HTL2 is between 1.9 and 2.0, the luminous efficiency of the OLED was maximized with preventing the decrease of the color viewing angle.

Experimental Example 4: Measurement of Luminous Properties of OLEDs by HTL2 Thickness An OLED where the refractive index of the HTL2 was set to 2.0 at 460 nm was designed using the same structure as Example 1, except that the thicknesses of the HTL2 were modified as illustrated in Table 4 below. The luminous properties or optical properties such as the blue luminous efficiency, color coordinate and color viewing angle [Δ u'v'] at 600 were evaluated as Experimental Example 1. The evaluation results are indicated in the following Table 4.

TABLE 4

| Luminous Properties of OLED | | | | | |
|---|---|---|---|---|---|
| Sample | HTL2 thickness (Å) | cd/A | Bx | By | [Δ u'v'] |
| Ref. | 470 | 4.2 | 0.147 | 0.041 | 0.014 |
| 1 | 270 | 4.1 | 0.147 | 0.043 | 0.048 |
| 2 | 320 | 4.1 | 0.147 | 0.042 | 0.039 |
| 3 | 370 | 4.3 | 0.147 | 0.042 | 0.025 |
| 4 | 400 | 4.3 | 0.146 | 0.041 | 0.018 |
| 5 | 420 | 4.4 | 0.146 | 0.041 | 0.013 |
| 6 | 450 | 4.4 | 0.146 | 0.041 | 0.016 |
| 7 | 470 | 4.5 | 0.146 | 0.041 | 0.018 |
| 8 | 520 | 4.6 | 0.146 | 0.042 | 0.023 |
| 9 | 570 | 4.6 | 0.145 | 0.042 | 0.031 |
| 10 | 670 | 4.6 | 0.144 | 0.045 | 0.046 |

Ref.: HTL2 refractive index 1.85
1-10: HTL2 refractive index 2.0

As indicated in Table 4, when the thickness of the HTL2 is between 400 Å and 470 Å, the luminous efficiency of the OLED was maximized with preventing the decrease of the color viewing angle. In particular, when the thickness of the HTL2 is between 420 Å and 450 Å, the color viewing angel of the OLED was superior or equal to the OLED where no high refractive material was applied.

Experimental Example 5: Measurement of Luminous Properties of OLEDs by ETL1 Refractive Index An OLED was designed using the same structure as Example 1, except that the refractive indices (at 460 nm) of the ETL1 were modified as illustrated in Table 5 below. The luminous properties or optical properties such as the blue luminous efficiency, color coordinate and color viewing angle [Δ u'v'] at 60° were evaluated as Experimental Example 1. The evaluation results are indicated in the following Table 5.

TABLE 5

| Luminous Properties of OLED | | | | | |
|---|---|---|---|---|---|
| Sample | ETL1 Refractive Index | cd/A | Bx | By | [Δ u'v'] |
| Ref. | 1.84 | 4.2 | 0.147 | 0.041 | 0.014 |
| 1 | 1.90 | 4.3 | 0.146 | 0.042 | 0.012 |
| 2 | 1.95 | 4.4 | 0.146 | 0.042 | 0.011 |
| 3 | 2.00 | 4.5 | 0.146 | 0.042 | 0.015 |
| 4 | 2.05 | 4.6 | 0.145 | 0.042 | 0.020 |
| 5 | 2.10 | 4.7 | 0.145 | 0.042 | 0.025 |

As indicated in Table 5, when the refractive index of the ETL1 is between 1.9 and 1.95, the luminous efficiency of the OLED was maximized with preventing the decrease of the color viewing angle.

Experimental Example 6: Measurement of Luminous Properties of OLEDs by ETL1 Thickness An OLED was designed using the same structure as Example 1, except that the thicknesses of the ETL1 were modified as illustrated in Table 6 below. The luminous properties or optical properties such as the blue luminous efficiency, color coordinate and color viewing angle [Δ u'v'] at 600 were evaluated as Experimental Example 1. The evaluation results are indicated in the following Table 6.

TABLE 6

| Luminous Properties of OLED | | | | | |
|---|---|---|---|---|---|
| Sample | ETL1 thickness (Å) | cd/A | Bx | By | [Δ u'v'] |
| Ref. | 200 | 4.2 | 0.147 | 0.041 | 0.014 |
| 1 | 500 | 4.1 | 0.147 | 0.043 | 0.043 |
| 2 | 550 | 4.2 | 0.147 | 0.042 | 0.034 |
| 3 | 600 | 4.3 | 0.147 | 0.042 | 0.026 |
| 4 | 650 | 4.5 | 0.146 | 0.042 | 0.019 |
| 5 | 700 | 4.5 | 0.146 | 0.042 | 0.015 |
| 6 | 750 | 4.6 | 0.145 | 0.043 | 0.014 |
| 7 | 800 | 4.6 | 0.145 | 0.044 | 0.018 |
| 8 | 850 | 4.6 | 0.144 | 0.045 | 0.047 |
| 9 | 900 | 4.5 | 0.143 | 0.047 | 0.030 |

Ref.: ETL refractive index 1.85

As indicated in Table 6, when the thickness of the ETL1 is between 650 Å and 800 Å, the luminous efficiency of the OLED was maximized with preventing the decrease of the color viewing angle. In particular, when the thickness of the ETL1 is between 700 Å and 750 Å, the color viewing angel of the OLED was equal to the OLED where no high refractive material was applied.

Experimental Example 7: Measurement of Luminous Properties of OLEDs by ETL1/HTL2 Refractive Indices An OLED was designed using the same structure as Example 1, except that the thickness of the HTL2 was set to have 520 Å, the thickness of the ETL1 was set to have 150 Å, the refractive indices (at 460 nm) of the ETL1 and the HTL2 were modified as illustrated in Table 7 below. The luminous properties or optical properties such as the blue luminous efficiency, color coordinate and color viewing angle [Δ u'v'] at 600 were evaluated as Experimental Example 1. The evaluation results are indicated in the following Table 7.

TABLE 7

| Luminous Properties of OLED | | | | | |
|---|---|---|---|---|---|
| Sample | ETL1/HTL2 Refractive Index | cd/A | Bx | By | [Δ u'v'] |
| Ref. | 1.84 | 4.2 | 0.147 | 0.041 | 0.014 |
| 1 | 1.90 | 4.4 | 0.146 | 0.042 | 0.016 |
| 2 | 1.95 | 4.5 | 0.146 | 0.042 | 0.016 |
| 3 | 2.00 | 4.5 | 0.146 | 0.041 | 0.017 |
| 4 | 2.05 | 4.6 | 0.146 | 0.041 | 0.019 |
| 5 | 2.10 | 4.6 | 0.146 | 0.041 | 0.021 |

As indicated in Table 7, when the refractive index of the ETL1 and the HTL2 is between 1.9 and 2.0, the luminous efficiency of the OLED was maximized with preventing the decrease of the color viewing angle.

Experimental Example 8: Measurement of Luminous Properties of OLEDs by ETL1/HTL2 Thickness An OLED was designed using the same structure as Example 1, except that the refractive indices of the HTL2 and the ETL1 were set to have 2.0 (at 460 nm), and the thicknesses of the ETL1 and the HTL2 were modified as illustrated in Table 8 below. The luminous properties or optical properties such as the blue luminous efficiency, color coordinate and color viewing angle [Δ u'v'] at 60° were evaluated as Experimental Example 1. The evaluation results are indicated in the following Table 8.

TABLE 8

| Luminous Properties of OLED | | | | | | |
|---|---|---|---|---|---|---|
| Sample | HTL2 thickness (Å) | ETL 1 thickness (Å) | cd/A | Bx | By | [Δ u'v'] |
| Ref. | 770 | 200 | 4.2 | 0.147 | 0.041 | 0.014 |
| 1 | 320 | 350 | 4.5 | 0.145 | 0.043 | 0.020 |
| 2 | 370 | 300 | 4.5 | 0.145 | 0.043 | 0.019 |
| 3 | 420 | 250 | 4.5 | 0.146 | 0.042 | 0.018 |
| 4 | 470 | 200 | 4.5 | 0.146 | 0.042 | 0.017 |
| 5 | 520 | 150 | 4.5 | 0.146 | 0.041 | 0.017 |
| 6 | 570 | 100 | 4.5 | 0.146 | 0.041 | 0.019 |
| 7 | 620 | 50 | 4.6 | 0.146 | 0.041 | 0.021 |

Ref.: ETL refractive index 1.85

As indicated in Table 8, when the thickness of the HTL2 is between 370 Å and 570 Å, particularly, 470 Å and 520 Å, and the thickness of the ETL1 is between 100 Å and 300 Å, particularly, 150 Å and 200 Å, the luminous efficiency of the OLED was maximized with preventing the decrease of the color viewing angle.

It will be apparent to those skilled in the art that various modifications and variations may be made in the present disclosure without departing from the scope of the disclosure. Thus, it is intended that the present disclosure cover the modifications and variations of the present disclosure provided they come within the scope of the appended claims and their equivalents.

What is claimed is:

1. An organic light emitting diode, comprising:
a first electrode;
a second electrode facing the first electrode; and
an emissive layer disposed between the first electrode and the second electrode,
wherein the emissive layer comprises:
a first emitting part disposed between the first electrode and the second electrode;
a second emitting part disposed between the first emitting part and the second electrode;
a third emitting part disposed between the second emitting part and the second electrode;
a fourth emitting part disposed between the third emitting part and the second electrode;
a first charge generation layer disposed between the first emitting part and the second emitting part;
a second charge generation layer disposed between the second emitting part and the third emitting part; and
a third charge generation layer disposed between the third emitting part and the fourth emitting part,
wherein the first emitting part comprises:
a first emitting material layer;
a first hole transport layer disposed between the first electrode and the first emitting material layer; and
an electron transport layer disposed between the first emitting material layer and the first charge generation layer,
wherein the second emitting part comprises:
a second emitting material layer;
a second hole transport layer disposed between the second emitting material layer and the first charge generation layer and spaced apart from the second emitting material layer; and a third hole transport layer disposed between the second emitting material layer and the second hole transport layer, and wherein at least one of the electron transport layer or the second hole transport layer has a refractive index in a range between 1.9 and 2.1.

2. The organic light emitting diode of claim 1, wherein the second hole transport layer has a refractive index in a range between 1.9 and 2.0.

3. The organic light emitting diode of claim 1, wherein the second hole transport layer has a thickness in a range between 400 Å and 470 Å.

4. The organic light emitting diode of claim 1, wherein the second hole transport layer has a thickness in a range between 420 Å and 450 Å.

5. The organic light emitting diode of claim 1, wherein the electron transport layer has a refractive index in a range between 1.9 and 1.95.

6. The organic light emitting diode of claim 1, wherein the electron transport layer has a thickness in a range between 650 Å and 800 Å.

7. The organic light emitting diode of claim 1, wherein the electron transport layer has a thickness in a range between 700 Å and 750 Å.

8. The organic light emitting diode of claim 1, wherein the second hole transport layer and the electron transport layer have a refractive index in a range between 1.9 and 2.0.

9. The organic light emitting diode of claim 1, wherein the second hole transport layer has a thickness in a range between 370 Å and 570 Å and the electron transport layer has a thickness in a range between 100 Å and 300 Å.

10. The organic light emitting diode of claim 1, wherein the first emitting material layer is a red emitting material layer, the second emitting material layer is a blue emitting material layer, the fourth emitting part comprises a blue emitting material layer, and the third emitting part comprises a green emitting material layer.

11. An organic light emitting diode, comprising:

a first electrode;

a second electrode facing the first electrode; and an emissive layer disposed between the first electrode and the second electrode, wherein the emissive layer comprises:

a first emitting part disposed between the first electrode and the second electrode;

a second emitting part disposed between the first emitting part and the second electrode;

a third emitting part disposed between the second emitting part and the second electrode;

a fourth emitting part disposed between the third emitting part and the second electrode;

a first charge generation layer disposed between the first emitting part and the second emitting part;

a second charge generation layer disposed between the second emitting part and the third emitting part; and a third charge generation layer disposed between the third emitting part and the fourth emitting part, wherein the first emitting part comprises:

a hole injection layer disposed between the first electrode and the first charge generation layer;

a first hole transport layer disposed between the hole injection layer and the first charge generation layer;

a red emitting material layer disposed between the first hole transport layer and the first charge generation layer; and a first electron transport layer disposed between the red emitting material layer and the first charge generation layer, wherein the second emitting part comprises:

a second hole transport layer disposed between the first charge generation layer and the second charge generation layer;

a third hole transport layer disposed between the second hole transport layer and the second charge generation layer;

a first blue emitting material layer disposed between the third hole transport layer and the second charge generation layer; and a second electron transport layer disposed between the first blue emitting material layer and the second charge generation layer, wherein the third emitting part comprises:

a fourth hole transport layer disposed between the second charge generation layer and the third charge generation layer;

a green emitting material layer disposed between the fourth hole transport layer and the third charge generation layer; and a third electron transport layer disposed between the green emitting material layer and the third charge generation layer, wherein the fourth emitting part comprises:

a fifth hole transport layer disposed between the third charge generation layer and the second electrode;

a sixth hole transport layer disposed between the fifth hole transport layer and the second electrode;

a second blue emitting material layer disposed between the sixth hole transport layer and the second electrode;

a fourth electron transport layer disposed between the second blue emitting material layer and the second electrode; and an electron injection layer disposed between the fourth electron transport layer and the second electrode, and wherein at least one of the first electron transport layer or the second hole transport layer has a refractive index in a range between 1.9 and 2.1.

12. The organic light emitting diode of claim 11, wherein the second hole transport layer has a refractive index in a range between 1.9 and 2.0.

13. The organic light emitting diode of claim 11, wherein the second hole transport layer has a thickness in a range between 400 Å and 470 Å.

14. The organic light emitting diode of claim 11, wherein the second hole transport layer has a thickness in a range between 420 Å and 450 Å.

15. The organic light emitting diode of claim 11, wherein the first electron transport layer has a refractive index in a range between 1.9 and 1.95.

16. The organic light emitting diode of claim 11, wherein the first electron transport layer has a thickness in a range between 650 Å and 800 Å.

17. The organic light emitting diode of claim 11, wherein the first electron transport layer has a thickness in a range between 700 Å and 750 Å.

18. The organic light emitting diode of claim 11, wherein the second hole transport layer and the first electron transport layer have a refractive index in a range between 1.9 and 2.0.

19. The organic light emitting diode of claim 11, wherein the second hole transport layer has a thickness in a range between 370 Å and 570 Å and the first electron transport layer has a thickness in a range between 100 Å and 300 Å.

20. An organic light emitting device, comprising:
a substrate; and
the organic light emitting diode of claim 1 over the substrate.

21. An organic light emitting device, comprising:
a substrate; and
the organic light emitting diode of claim 11 over the substrate.

* * * * *